(12) United States Patent
Huang et al.

(10) Patent No.: US 9,859,341 B2
(45) Date of Patent: Jan. 2, 2018

(54) OLED DISPLAY

(71) Applicant: InnoLux Corporation, Miao-Li County (TW)

(72) Inventors: Hao-Jung Huang, Miao-Li County (TW); Chia-Pin Kang, Miao-Li County (TW); Che-Wei Lin, Miao-Li County (TW); Hao-Yu Chou, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 15/202,030

(22) Filed: Jul. 5, 2016

(65) Prior Publication Data
US 2016/0315126 A1 Oct. 27, 2016

Related U.S. Application Data

(63) Continuation of application No. 14/699,368, filed on Apr. 29, 2015, now Pat. No. 9,412,795, which is a (Continued)

(30) Foreign Application Priority Data

Mar. 4, 2013 (TW) .............................. 102107438 A

(51) Int. Cl.
*H01L 29/08* (2006.01)
*H01L 29/20* (2006.01)
(Continued)

(52) U.S. Cl.
CPC ........ *H01L 27/3216* (2013.01); *H01L 27/326* (2013.01); *H01L 27/3209* (2013.01); *H01L 27/3218* (2013.01); *H01L 51/001* (2013.01); *H01L 51/0011* (2013.01); *H01L 51/504* (2013.01); *H01L 51/0068* (2013.01); *H01L 51/0545* (2013.01); *H01L 51/50* (2013.01)

(58) Field of Classification Search
CPC ............... H01L 51/504; H01L 51/0068; H01L 51/0545; H01L 51/50
USPC .............................................. 257/40, 89, 98
See application file for complete search history.

(56) References Cited

U.S. PATENT DOCUMENTS

2002/0186214 A1 12/2002 Siwinski
2004/0201558 A1 10/2004 Arnold et al.
(Continued)

OTHER PUBLICATIONS

Chinese language office action dated Apr. 29, 2015, issued in application No. TW 102107438.
(Continued)

*Primary Examiner* — Dzung Tran
(74) *Attorney, Agent, or Firm* — McClure, Qualey & Rodack, LLP

(57) ABSTRACT

An OLED display is disclosed, which includes a substrate and a plurality of pixel groups arranged on the substrate. Each pixel group includes a first, a second, a third and a fourth sub-pixel. Arrangements of the first, second, third and fourth sub-pixels in two neighboring pixel groups are symmetrical with each other. In addition, the distance between the third sub-pixels and the distance between the fourth sub-pixels in two neighboring pixel group are greater than the distance between the first sub-pixels in the two neighboring pixel group.

9 Claims, 6 Drawing Sheets

Related U.S. Application Data continuation of application No. 14/132,247, filed on Dec. 18, 2013, now Pat. No. 9,117,782.

(51) Int. Cl.
*H01L 33/00* (2010.01)
*H01L 27/32* (2006.01)
*H01L 51/50* (2006.01)
*H01L 51/05* (2006.01)
*H01L 51/00* (2006.01)

(56) References Cited

U.S. PATENT DOCUMENTS

| | | | |
|---|---|---|---|
| 2005/0001542 A1* | 1/2005 | Kiguchi | H01L 27/3216 313/504 |
| 2005/0127819 A1* | 6/2005 | Ohtani | H05B 33/0821 313/500 |
| 2005/0151462 A1 | 7/2005 | Miyagawa | |
| 2006/0028495 A1 | 2/2006 | Phan | |
| 2007/0001584 A1* | 1/2007 | Lee | H01L 27/3251 313/500 |
| 2007/0132356 A1 | 6/2007 | Hashimoto | |
| 2008/0224968 A1* | 9/2008 | Kashiwabara | G09G 3/2003 345/83 |
| 2008/0231554 A1* | 9/2008 | Lee | H01L 27/3218 345/63 |
| 2009/0121983 A1 | 5/2009 | Sung et al. | |
| 2009/0195144 A1 | 8/2009 | Kitabayashi | |
| 2011/0133227 A1 | 6/2011 | Lee et al. | |
| 2011/0279493 A1 | 11/2011 | Phan | |

OTHER PUBLICATIONS

Chinese language office action dated Oct. 2, 2015, issued in application No. TW 102107438.

\* cited by examiner

OLED DISPLAY

CROSS REFERENCE TO RELATED APPLICATIONS

This Application is a continuation of U.S. patent application Ser. No. 14/699,368, filed on Apr. 29, 2015, now U.S. Pat. No. 9,412,795, which is a continuation of U.S. patent application Ser. No. 14/132,247, filed on Dec. 18, 2013 (now U.S. Pat. No. 9,117,782, issued on Aug. 25, 2015), which claims priority to Taiwan Patent Application No. 102107438, filed on Mar. 4, 2013. The contents of these prior applications are incorporated herein by reference.

BACKGROUND

Field of the Invention

The disclosure relates to a color organic light emitting diode (OLED) display, and in particular relates to an OLED display having better display resolution by adjusting an arrangement of pixel units thereof.

Description of the Related Art

An organic light emitting diode (OLED) generally includes a cathode, and an anode and organic materials disposed between the cathode and the anode. The illuminance of the OLED is determined by the electric current flowing from the anode to the cathode. Therefore, in order to improve the illuminance of an OLED, a large driving voltage should be applied thereto so as to increase the electric current passing therethrough and enable the formation of an exciton, i.e. a recombination of the "electron-hole".

The manufacturing of an OLED display involves the use of a metal mask when evaporating organic materials. However, as the precision of the metal mask cannot be improved, the current technology can only produce products with display resolution of 200-250 pixels per inch (PPI). Therefore, the competitiveness of OLED products is hindered due to limitation in display resolution.

SUMMARY

In light of the foregoing, one of the disclosed embodiments provides an OLED display in which a conventional metal mask is used to evaporate organic materials on a substrate which is arranged with pixel electrodes to define sub-pixels with special patterns so as to improve display resolution.

According to one embodiment, the OLED display includes a substrate and a plurality of pixel groups arranged in a number of directions on the substrate. Each of the plurality of pixel groups includes a first sub-pixel, a second sub-pixel, a third sub-pixel, and a fourth sub-pixel. The first sub-pixel and the second sub-pixel correspond to the same color, the third sub-pixel and the fourth sub-pixel respectively correspond to two different colors. Arrangements of the first, second, third and fourth sub-pixels in two neighboring pixel groups of the plurality of pixel groups are symmetrical with each other. There is a first distance between the first sub-pixels in the two neighboring pixel groups, there is a second distance between the second sub-pixels in the two neighboring pixel groups, there is a third distance between the third sub-pixels in the two neighboring pixel groups, and there is a fourth distance between the fourth sub-pixels in the two neighboring pixel groups.

In the above-mentioned embodiment, the first sub-pixel is arranged closer to the third sub-pixel than the second sub-pixel, and the second sub-pixel is arranged closer to the fourth sub-pixel than the first sub-pixel. Both the third distance and the fourth distance are greater than the first distance. Alternatively, both the third distance and the fourth distance are greater than the second distance.

In the above-mentioned embodiment, colors of the first, second, third and fourth sub-pixels in the two neighboring pixel groups are symmetrical with each other.

In the above-mentioned embodiment, the first sub-pixel, the second sub-pixel, the third sub-pixel and the fourth sub-pixel respectively correspond to a first pixel electrode, a second pixel electrode, a third pixel electrode, and a fourth pixel electrode In the above-mentioned embodiment, the first distance is between a first boundary of the first sub-pixel in a first of the two neighboring pixel groups and a second boundary of the first sub-pixel in a second of the two neighboring pixel groups; the second distance is between a third boundary of the second sub-pixel in the first of the two neighboring pixel groups and a fourth boundary of the second sub-pixel in the second of the two neighboring pixel groups; the third distance is between a fifth boundary of the third sub-pixel in the first of the two neighboring pixel groups and a sixth boundary of the third sub-pixel in the second of the two neighboring pixel groups; and the fourth distance is between a seventh boundary of the fourth sub-pixel in the first of the two neighboring pixel groups and a eighth boundary of the fourth sub-pixel in the second of the two neighboring pixel groups.

In the above-mentioned embodiment, regions inside the first, second, third, fourth, fifth, sixth, seventh and eighth boundaries are capable of emitting light In the above-mentioned embodiment, the first sub-pixel is arranged closer to the third sub-pixel than the second sub-pixel.

In the above-mentioned embodiment, the light emitted from the first sub-pixel and the second sub-pixel in an excited state is blue light, the light emitted from the third sub-pixel in an excited state is red light, and the light emitted from the fourth sub-pixel in an excited state is green light.

In the above-mentioned embodiment, an area of the first sub-pixel is substantially equal to an area of the second sub-pixel.

In the above-mentioned embodiment, an area of the third sub-pixel is substantially equal to an area of the fourth sub-pixel.

In the above-mentioned embodiment, the first, second, third and fourth sub-pixels in the two neighboring pixel groups are symmetrical with each other with respect to a longitudinal axis that is orthogonal with a direction along which the two neighboring pixel groups are arranged.

According to one another embodiment, the OLED display includes the OLED display includes a substrate and a plurality of pixel groups arranged in a number of directions on the substrate. Each of the plurality of pixel groups includes a first sub-pixel, a second sub-pixel, a third sub-pixel, and a fourth sub-pixel. The first sub-pixel and the second sub-pixel correspond to the same color, the third sub-pixel and the fourth sub-pixel respectively correspond to two different colors. Along a first of the directions, arrangements of the first, second, third and fourth sub-pixels in two pixel groups of the plurality of pixel groups are symmetrical with each other. A first distance between the first sub-pixels in the two pixel groups is different from a second distance between the third sub-pixels in the two pixel groups. A reference line is defined to be orthogonal with the first of the directions and between the third sub-pixel and the fourth sub-pixel. There is a third distance between the third sub-pixel and the reference line, there is a fourth distance between the first sub-pixel and the reference line, and there is a fifth distance between the second sub-pixel and the reference line. The third distance is greater than the fourth distance, and the third distance is greater than the fifth distance.

In the above-mentioned embodiment, one of the two pixel groups is adjacent to another one of the two pixel groups.

In the above-mentioned embodiment, along the first of the directions, colors of the two pixel groups are symmetrical with each other.

In the above-mentioned embodiment, the first distance is between a first boundary of the first sub-pixel in a first of the two pixel groups and a second boundary of the first sub-pixel in a second of the two pixel groups, and the second distance is between a third boundary of the third sub-pixel in the first of the two pixel groups and a fourth boundary of the third sub-pixel in the second of the two pixel groups.

In the above-mentioned embodiment, the third distance is between the third boundary and the reference line, a fourth distance is between the first boundary and the reference line, and a fifth distance is between a fifth boundary of the second sub-pixel and the reference line.

In the above-mentioned embodiment, regions inside the first, second, third, fourth and fifth boundaries are capable of emitting light.

In the above-mentioned embodiment, the reference line is separated from the first sub-pixel and the second sub-pixel by a distance.

In the above-mentioned embodiment, a sixth distance between the fourth sub-pixels in the two pixel groups is the same as the second distance.

BRIEF DESCRIPTION OF THE DRAWINGS

The present invention is more fully understood by reading the subsequent detailed description and examples with references made to the accompanying drawings, wherein.

DETAILED DESCRIPTION

Several exemplary embodiments of the application are described with reference to FIGS. 1 through 6. It is to be understood that the following disclosure provides various different embodiments as examples for implementing different features of the application. This description is made for the purpose of illustrating the general principles of the invention and should not be taken in a limiting sense.

Figure 1:
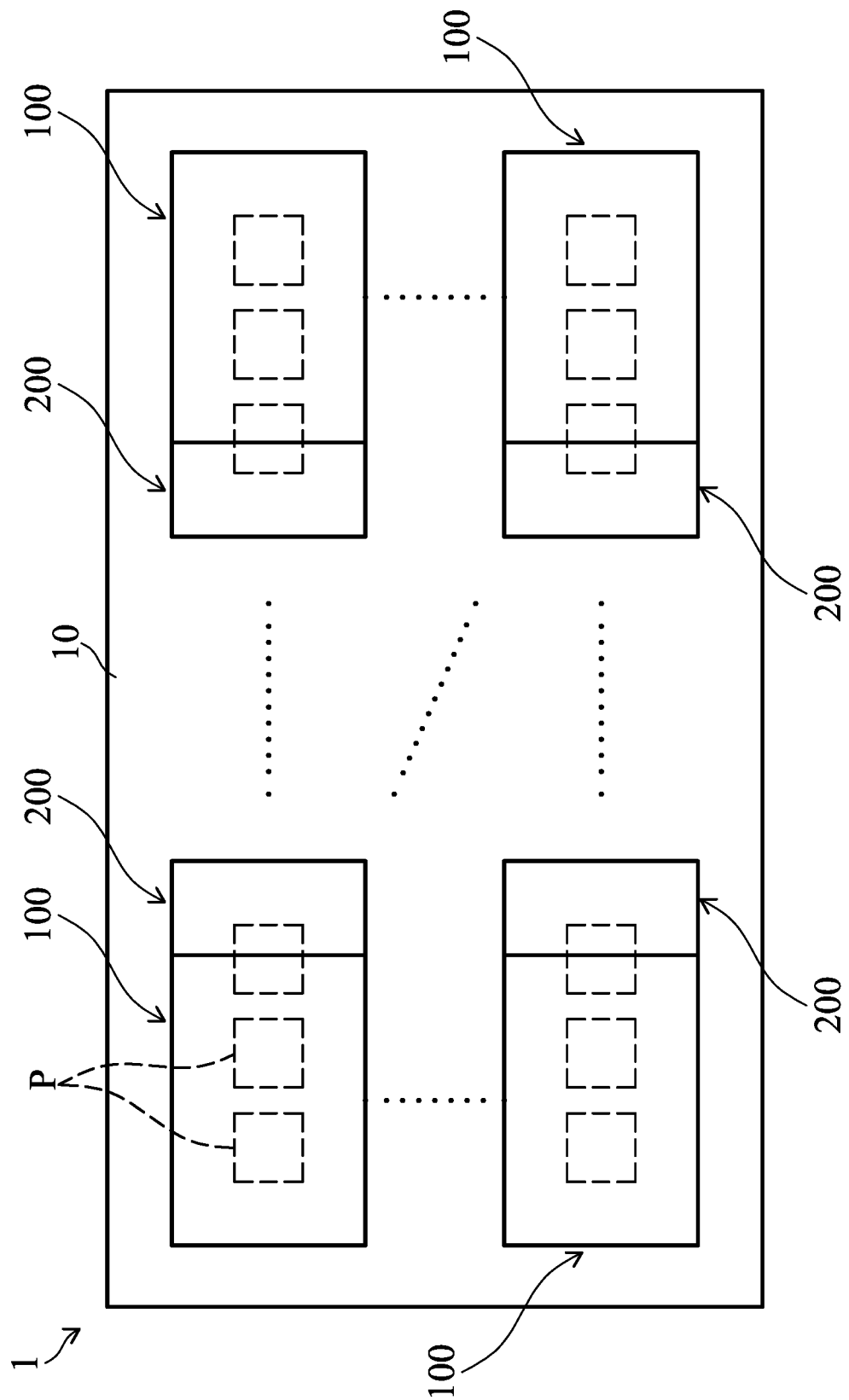
FIG. 1 shows a top view of an OLED display of an embodiment of the present disclosure.

Referring to FIG. 1, in accordance with one embodiment of the present disclosure, the OLED display 1 includes a substrate 10, a plurality of first light-emitting units 100 and a plurality of second light-emitting units 200. Before the plurality of first light-emitting units 100 and plurality second light-emitting units 200 are disposed on the substrate 10, a plurality of pixel electrodes (not shown in figure) are disposed on the substrate 10 in advance, wherein the pixel electrodes are controlled by suitable means so as to implement the operation of the pixels of the OLED display 1.

In the embodiment, the plurality of first light-emitting units 100 and plurality second light-emitting units 200 arranged in a matrix are formed on the electrode pixels of the substrate 10 by vaporizing, wherein the plurality of first light-emitting units 100 and plurality second light-emitting units 200 are arranged alternatively in a traversal direction to successively define a plurality of pixel unit P on the substrate 10.

Figure 2:
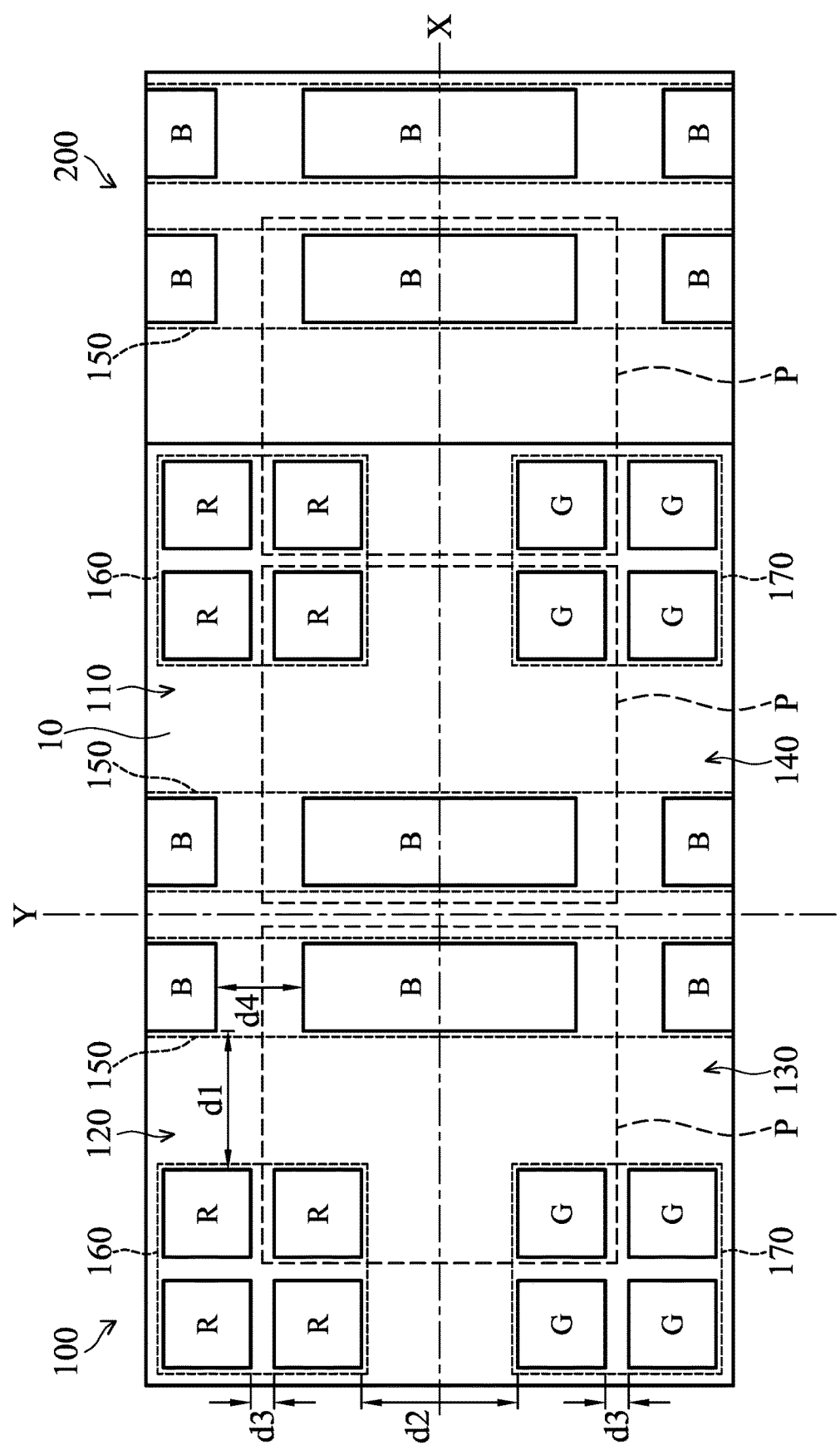
FIG. 2 shows a schematic view of a first and a second lighting element of the OLED display of the embodiment of the present disclosure.

Specifically, referring to FIG. 2, a transverse axis X and a longitudinal axis Y orthogonal to the transverse axis X divide each of the plurality of first light-emitting units 100 into a first region 110, a second region 120, a third region 130 and a fourth region 140, wherein the first and third regions 110, 130 are located at opposite corners of each of the plurality of first light-emitting units 100, and the second and fourth regions 120, 140 are diagonally located at the other opposite corners of the plurality of first light-emitting units 100.

The plurality of first light-emitting units 100 each include a first light-emissive layer 150, two second light-emissive layers 160 and two third light-emissive layers 170, and the second light-emitting units 200 each include a first light-emissive layer 150. The first light-emissive layer 150 of the plurality of first light-emitting units 100 overlaps with the longitudinal axis Y. The two second light-emissive layers 160 are disposed in the first and second regions 110, 120 and spaced apart from the first light-emissive layer 150 by a distance d1. The two third light-emissive layers 170 are disposed in the third and fourth regions 130, 140 and spaced apart from the first light-emissive layer 150 at a distance d1. Additionally, each second light-emissive layer 160 and each of third light-emissive layer 170 are spaced apart from each other at a distance d2 in a direction parallel to the longitudinal axis Y. The first light-emissive layer 150 of each of the plurality of second light-emitting units 200 has the same arrangement as that of the first light-emissive layer 150 of each of the plurality of first light-emitting units 100 and are adjacent to one of the plurality of first light-emitting units 100 in a direction parallel to the transverse axis X.

As shown in FIG. 2, the first, second and third light-emissive layers 150, 160 and 170 of each of the plurality of first light-emitting units 100 and the first light-emissive layer 150 of each of the plurality of second light-emitting units 200, respectively, correspond to a plurality of first, second and third sub-pixels B, R and G, wherein each of the first light-emissive layer 150 corresponds to a plurality of first sub-pixels B which are spaced apart at a distance d4, and each second light-emissive layer 160 corresponds to four second sub-pixels R which are spaced apart at a distance d3, and each of third light-emissive layer 170 corresponds to four third sub-pixels G which are spaced apart at a distance d3. In the embodiment, the light emitted from the first light-emissive layers 150 in an excited state is blue light, the light emitted from the second light-emissive layers 160 in an excited state is red light, and the light emitted from the third light-emissive layers 170 in an excited state is green light.

One skilled in the art will appreciate that while the first, second and third light-emissive layers 150, 160 and 170 are successively extended on the regions of the substrate 10, lights with specific wavelengths can only be able to be emitted from the first, second and third sub-pixels B, R and G when the first, second and third sub-pixels B, R and G, which corresponds to the pixel electrodes (not shown in figure) of the substrate 10, are excited by electric current. Thus, in FIG. 2, the first, second and third light-emissive layers 150, 160 and 170 are shown in dashed line, and the first, second and third sub-pixels B, R and G which are capable of emitting light is shown in solid line.

In this regard, in each of the plurality of first light-emitting units 100 the sub-pixels in the first and fourth regions 110, 140 and the sub-pixels in the second and third regions 120, 130 are symmetrical with each other with respect to the longitudinal axis Y, thereby defining two pixel units P in each side of the longitudinal axis Y, wherein each pixel unit P includes one first sub-pixel B, one second sub-pixel R and one third sub-pixel G. Additionally, referring to FIGS. 1 and 2, a plurality of pixel units are defined in between each of the plurality of first light-emitting units 100 and the neighboring first light-emitting unit 100 in a longitudinal axis Y and in between each of the plurality of first light-emitting units 100 and the neighboring second light-emitting unit 200 in a transverse axis X. Moreover, the arrangements of the first, second and third sub-pixels B, R and G in two neighboring pixel units P are symmetrical with each other in the direction parallel to the longitudinal axis Y.

Due to drawbacks where the blue light-emissive layers tend to malfunction when operating with high electric currents, a method is provided in the embodiment. As shown in FIG. 2, a length of the first sub-pixels B in the direction parallel to the longitudinal axis Y is larger than a length of the second sub-pixels G or a length of the third sub-pixels R in the direction parallel to the longitudinal axis Y. In a single pixel unit P an area of the first sub-pixel B is larger than an area of the second sub-pixel G, and the area of the first sub-pixel is larger than an area of the third sub-pixel R. Thus, a smaller electric current is applied to the first sub-pixels B than that applied to the second and third sub-pixels R and G, and the first, second and third sub-pixels B, R and G may emit lights with same illuminance.

The manufacturing method of the OLED display 1 is described in detail. Firstly, driving circuits and pixel electrodes (not shown in figures) are formed on the substrate 10, and metal masks 300, 400 and 500 shown in FIG. 3A(1)-3C are configured to evaporate organic materials on the substrate 10. Specifically, the metal mask 300 includes an opening 310 with a rectangular shape, wherein the size and position of the opening 310 are determined according to the size and positions of the first light-emissive layers 150. The metal mask 400 includes two rectangular shaped openings 410 and, the sizes and positions of the openings 410 are determined according to the size and positions of the second light-emissive layers 160. The metal mask 500 includes two rectangular shapes openings 510, and the sizes and positions of the openings 510 are determined according to the size and positions of the third light-emissive layers 170.

In order to allow for tolerance during alignment, the distances between the first, second and third light-emissive layers 150, 160 and 170 are larger than the distance between the sub-pixels in corresponding light-emissive layers. Specifically, the distance d2 between one of the second light-emissive layers 160 and one of the third light-emissive layers 170 in a direction parallel to the longitudinal axis Y is larger than the distance d3 between the second sub-pixels R in each of the second light-emissive layer 160 and is larger than the distance d3 between the third sub-pixels G in each of the third light-emissive layer 170. Additionally, the distance d1 between each of the second light-emissive layer 160 and one of the closest first light-emissive layers 150 in the direction parallel to the transverse axis X or the distance d1 between each of the third light-emissive layers 170 and one of the closest first light-emissive layers 150 in the direction parallel to the transverse axis X is larger than the distance d3 between the second sub-pixels R in each of the second light-emissive layer 160 and is larger than the distance d3 between the third sub-pixels G in each of the third light-emissive layer 170 and is larger than a distance d4 between the first sub-pixels B in each of the first light-emissive layer 150.

Note that, the metal masks 300, 400 and 500 each have a resolution of 200 pixels per inch (PPI), which are commercially available. In one exemplary embodiment, the distance d1 ranges about 24.3±12 mm, the distance d2 ranges about 23.0±12 mm, the distance d3 ranges about 8±12 mm, and the distance d4 ranges about 14±12 mm. A width of each pixel unit P ranges about 55±12 mm, such that a display resolution of the OLED display 1 is 460 PPI.

Figure 4:
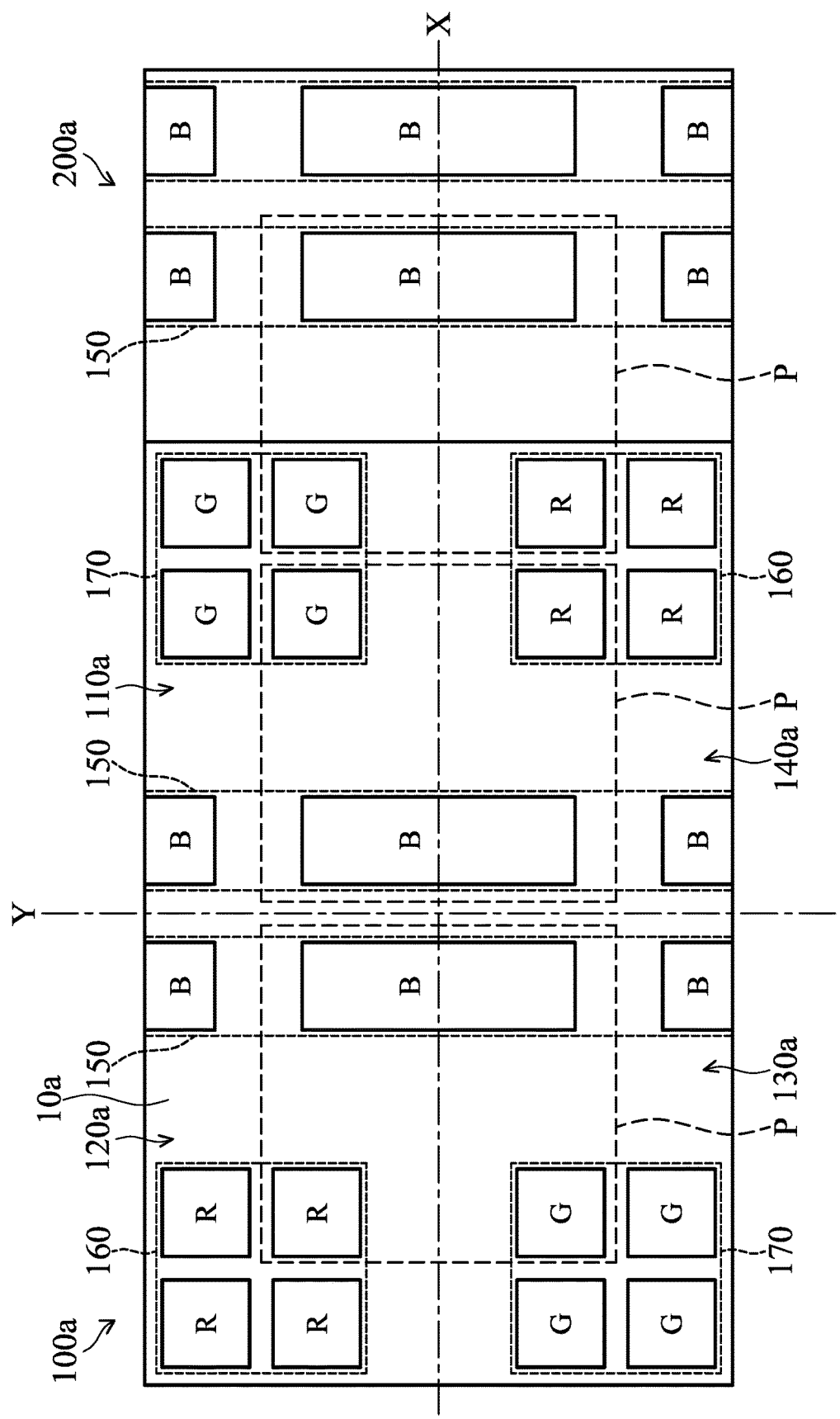
FIG. 4 shows a schematic view of a first and a second lighting element of the other embodiment of the present disclosure.

Referring to FIG. 4, a schematic view of a first and a second light-emitting unit 100a, 200a of an OLED display in accordance with another embodiment is shown in FIG. 4, in which elements similar with that of the first and second light-emitting units 100, 200 shown in FIG. 2 are provided with the same reference numbers, and the features thereof are not reiterated in the interest of brevity. The plurality of first and second light-emitting units 100a, 200a differ from the plurality of first and second light-emitting units 100, 200 in that the two second light-emissive layers 160 are disposed in the second and fourth regions 120a and 140a, and the two third light-emissive layers 170 are disposed in the first and third regions 110a and 130a. That is, the sub-pixels in the first region 110a and the sub-pixels in the third region 130a are point symmetric to a center of each of the plurality of first light-emitting units 100a and arranged such that the metal mask for vaporizing the organic material may have a better mechanical strength.

Figure 5:
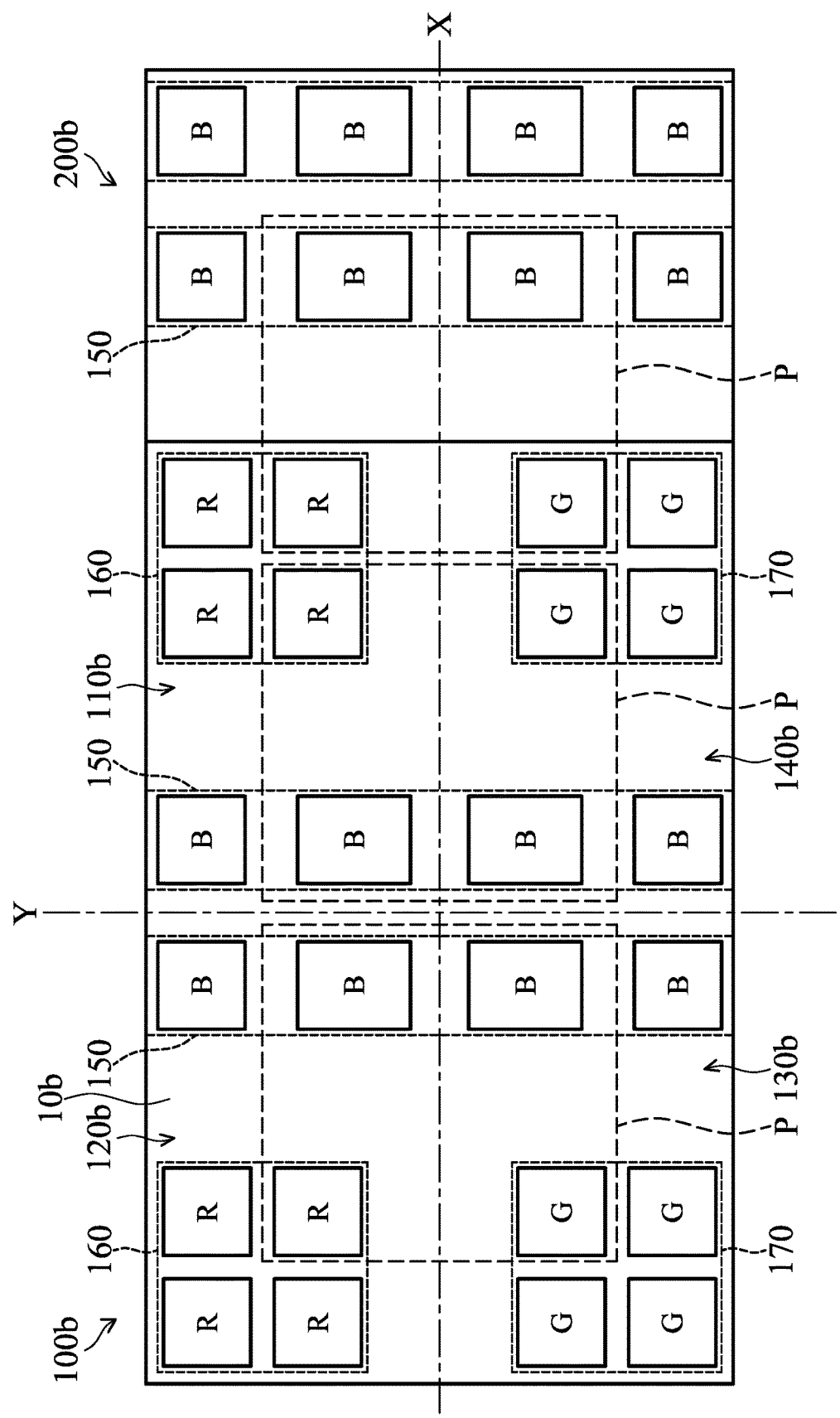
FIG. 5 shows a schematic view of a first and a second lighting element of the other embodiment of the present disclosure.

Referring to FIG. 5, a schematic view of a first and a second light-emitting unit 100b, 200b of an OLED display in accordance with another embodiment is shown in FIG. 5, in which elements similar with that of the plurality of first and second light-emitting units 100, 200 shown in FIG. 2 are provided with the same reference numbers, and the features thereof are not reiterated in the interest of brevity. The plurality of first and second light-emitting units 100b, 200b differ from the plurality of first and second light-emitting units 100, 200 in that each pixel unit P includes two first sub-pixels B, one second sub-pixel R and one sub-pixel G, thereby improving uniformity of illuminance of each pixel unit.

Figure 3B:
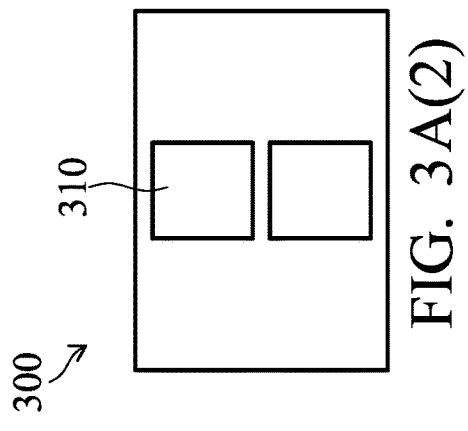
FIGS. 3A(1), 3A(2), 3B and 3C show masks of some embodiments of the present disclosure.
Figure 3B:
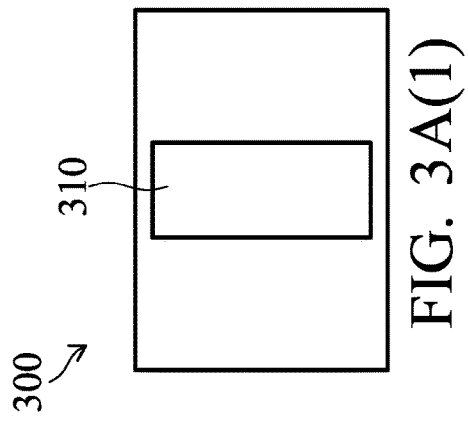
Figure 3B:
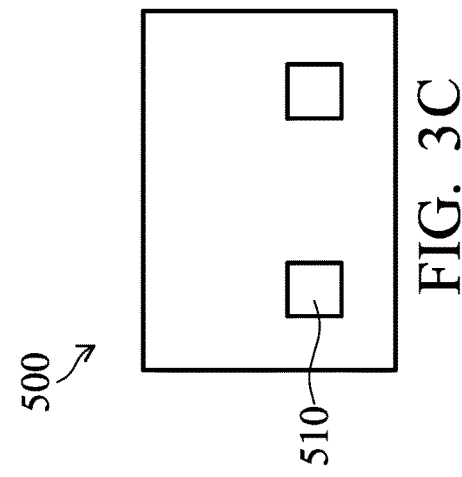
Figure 3C:
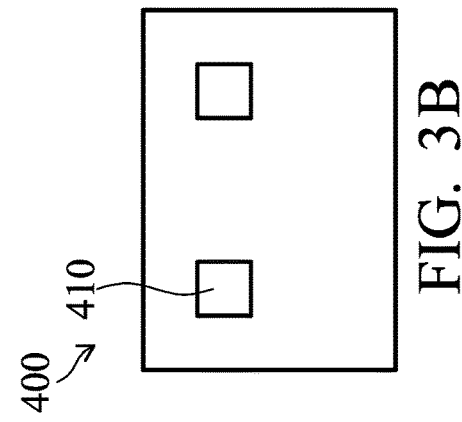
Figure 6:
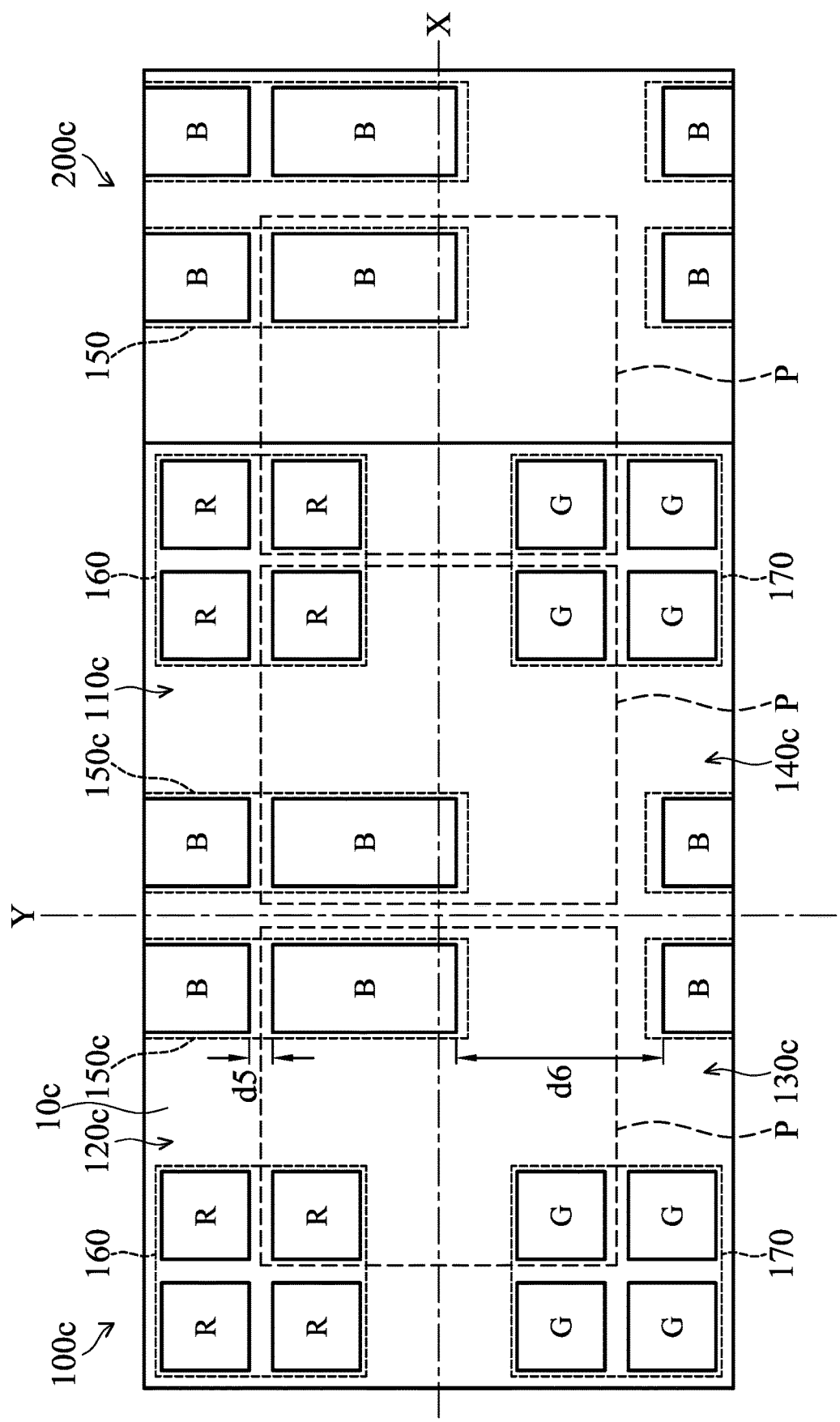
FIG. 6 shows a schematic view of a first and a second lighting element of the other embodiment of the present disclosure.

Referring to FIG. 6, a schematic view of a first and a second light-emitting unit 100c, 200c of an OLED display in accordance with another embodiment is shown in FIG. 6, in which elements similar with that of the plurality of first and second light-emitting units 100, 200 shown in FIG. 2 are provided with the same reference numbers, and the features thereof are not reiterated in the interest of brevity. The plurality of first and second light-emitting units 100c, 200c differ from the plurality of first and second light-emitting units 100, 200 in that in the direction parallel to the longitudinal axis Y the first sub-pixels 150c are spaced by a first distance d5 and a second distance d6 different from the first distance d5, periodically. While being manufactured, the first light-emissive layers 150*c* of the embodiment are evaporated by using a metal mask as shown in FIG. 3A(2).

By the arrangement of the sub-pixels, the OLED display manufactured by the same processing means as that of a conventional one may have a better display resolution, so as to improve the competitiveness of the OLED display.

While the invention has been described by way of example and in terms of the embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An OLED display, comprising:
    a substrate;
    a plurality of pixel groups, arranged in a number of directions on the substrate, wherein each of the plurality of pixel groups comprises:
    two first sub-pixels;
    a second sub-pixel; and
    a third sub-pixel;
    wherein the first, second and third sub-pixels in a first pixel group and a second pixel group of the plurality of pixel groups are symmetrical with each other with respect to a first reference line, and
    wherein a first distance between the two adjacent first sub-pixels in the first and the second pixel groups is different from a second distance between the second sub-pixels in the first and the second pixel groups;
    wherein a second reference line is defined to be orthogonal with the first reference line and between the second sub-pixel and the third sub-pixel in the first pixel group, and no sub-pixel is disposed between the second sub-pixel and the third sub-pixel in the first pixel group;
    wherein a third distance between the second sub-pixel in the first pixel group and the second reference line is greater than a fourth distance between one of the first sub-pixels in the first pixel group and the second reference line.

2. The OLED display as claimed in claim 1, wherein the first pixel group is adjacent to the second pixel group.

3. The OLED display as claimed in claim 1, wherein along the first reference line, colors of the first and the second pixel groups are symmetrical with each other.

4. The OLED display as claimed in claim 1, wherein the first distance is between a first boundary of the first sub-pixel in the first pixel group and a second boundary of the first sub-pixel in the second pixel group, and the second distance is between a third boundary of the second sub-pixel in the first pixel group and a fourth boundary of the second sub-pixel in the second pixel group.

5. The OLED display as claimed in claim 4, wherein the third distance is between the third boundary and the second reference line, a fourth distance is between the first boundary and the second reference line.

6. The OLED display as claimed in claim 5, wherein regions inside the first, second, third and fourth boundaries are capable of emitting light.

7. The OLED display as claimed in claim 1, wherein the second reference line is separated from the two first pixels in the first pixel group by a distance.

8. The OLED display as claimed in claim 1, wherein a fifth distance between the third sub-pixels in the first and the second pixel groups is the same as the second distance.

9. The OLED display as claimed in claim 1, wherein a sixth distance between the third sub-pixel in the first pixel group and the second reference line is greater than the fourth distance.

* * * * *